(12) United States Patent
Hsu et al.

(10) Patent No.: US 8,421,213 B2
(45) Date of Patent: Apr. 16, 2013

(54) PACKAGE STRUCTURE

(75) Inventors: Shin-Ping Hsu, Hsin-Chu (TW); Zhao-Chong Zeng, Hsin-Chu (TW); Zhi-Hui Yang, Hsin-Chu (TW)

(73) Assignee: Unimicron Technology Corporation, Taoyuan (TW)

( * ) Notice: Subject to any disclaimer, the term of this patent is extended or adjusted under 35 U.S.C. 154(b) by 470 days.

(21) Appl. No.: 12/546,585

(22) Filed: Aug. 24, 2009

(65) Prior Publication Data

US 2011/0042800 A1  Feb. 24, 2011

(51) Int. Cl.
*H01L 23/04* (2006.01)
(52) U.S. Cl. .................. 257/698; 257/E23.063; 257/731
(58) Field of Classification Search .................. 257/698, 257/731, E23.063
See application file for complete search history.

(56) References Cited

U.S. PATENT DOCUMENTS

| | | | |
|---|---|---|---|
| 2006/0128069 A1* | 6/2006 | Hsu ................................ | 438/124 |
| 2007/0241444 A1* | 10/2007 | Hsu et al. ....................... | 257/692 |
| 2008/0006936 A1* | 1/2008 | Hsu ................................ | 257/731 |
| 2008/0116569 A1* | 5/2008 | Huang et al. .................. | 257/712 |
| 2008/0157358 A1* | 7/2008 | Yang .............................. | 257/737 |

* cited by examiner

*Primary Examiner* — Thien F Tran
(74) *Attorney, Agent, or Firm* — Peter F. Corless; Steven M. Jensen; Edwards Wildman Palmer LLP (57) ABSTRACT

A package structure includes a first carrier board provided with a through hole, at least a filling hole in communication with the through hole, a semiconductor chip received in the through hole, and a fastening member disposed in the filling hole and abutting against the semiconductor chip so as to secure the semiconductor chip in position, thereby preventing the semiconductor chip in the through hole from displacement under an external force.

19 Claims, 7 Drawing Sheets

PACKAGE STRUCTURE

BACKGROUND OF THE INVENTION

1. Field of the Invention

The present invention relates generally to a semiconductor package structure.

2. Description of Related Art

In addition to conventional wire bonding packages, the semiconductor industry developed, thanks to ever-evolving semiconductor packaging technology, various semiconductor device packages. For example, an IC semiconductor chip is directly embedded in a package substrate and electrically integrated therewith so as to reduce the whole size of the semiconductor device and enhance the electrical function thereof. Such a package type has become a mainstream.

Figure 1A:
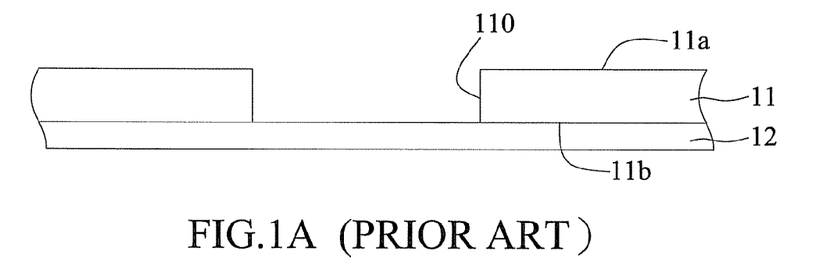
FIGS. 1A to 1D are schematic views of a method for fabricating a conventional package structure, wherein FIG. 1A' is a top view of FIG. 1A.

FIGS. 1A to 1D shows a method for fabricating a conventional package structure, wherein FIG. 1A' is a top view of FIG 1A.

Referring to FIGS. 1A and 1A', a first carrier board 11 having a first surface 11a and an opposing second surface 11b is provided, and a rectangular through hole 110 penetrating the first surface 11a and the second surface 11b is formed in the first carrier board 11. As shown in the drawings, a second carrier board 12 is provided and coupled to the second surface 11b of the first carrier board 11.

Figure 1B:
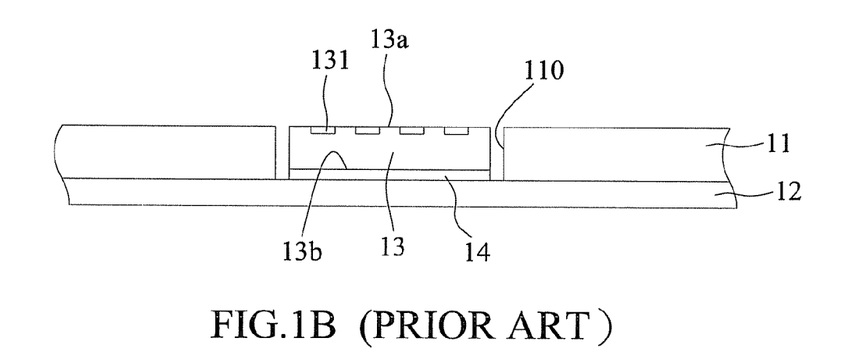

Referring to FIG. 1B, a semiconductor chip 13 is provided, which has an active surface 13a with a plurality of electrode pads 131 thereon and an inactive surface 13b opposing the active surface 13a. As shown in the drawing, the inactive surface 13b of the semiconductor chip 13 is fixed in position to the second carrier board 12 in the through hole 110 of the first carrier board 11 through an adhesion layer 14.

Figure 1C:
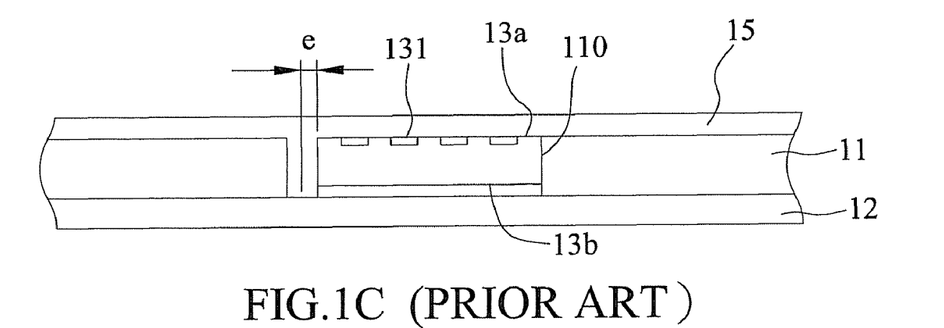

Referring to FIG. 1C, a dielectric layer 15 is formed on the first carrier board 11 and the active surface 13a of the semiconductor chip 13 by laminating. As shown in the drawing, the dielectric layer 15 fills the gap between the through hole 110 and the semiconductor chip 13.

Figure 1D:
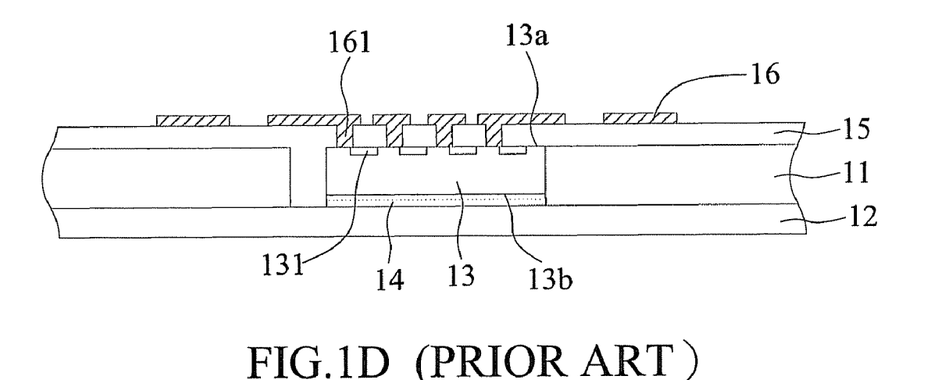

As shown in FIG. 1D, a wiring layer 16 is formed on the dielectric layer 15, and a plurality of conductive vias 161 are formed in the dielectric layer 15 for electrical connection with the electrode pads 131 of the semiconductor chip 13.

However, in the above-described prior art, since a gap exists between the semiconductor chip 13 and the through hole 110, the semiconductor chip 13 received in the through hole 110 may have a positional offset e caused by pressure or air bubbles created during the laminating of the dielectric layer 15, and in consequence the positional offset e contributes to an alignment offset between the conductive vias 161 and the electrode pads 131 and even causes failure of the electrical connection therebetween.

Therefore, it is imperative to overcome the above-described drawbacks of the prior art.

SUMMARY OF THE INVENTION

In view of the above drawbacks of the prior art, it is an objective of the present invention to provide a package structure capable of securing a semiconductor chip in position.

Another objective of the present invention is to provide a package structure capable of enhancing the product yield.

In order to achieve the above and other objectives, the present invention provides a package structure, which comprises: a first carrier board with a first surface and a second surface opposing the first surface, a through hole penetrating the first and second surfaces, and at least a filling hole in communication with the through hole; a semiconductor chip received in the through hole with a gap existing between them, wherein the semiconductor chip has an active surface with a plurality of electrode pads thereon and an inactive surface opposing the active surface and facing the same direction as the second surface of the first carrier board; and a fastening member fixed in position to the filling hole and abutting against the semiconductor chip so as to secure the semiconductor chip in position.

Therein, the first carrier board is one of a core board with circuits on both sides thereof, a multi-layer circuit board, a dielectric layer and a metal plate. The through hole has a square shape, a rectangular shape, or a polygonal shape. The first carrier board has a plurality of filling holes in communication with sides and/or corners of the through hole, respectively.

The fastening member is fixed in position to the gap between the semiconductor chip and the through hole, or fixed in position to the filling hole and a portion of the through hole.

The through hole has a round shape, an oval shape or any other shape made up of curves. The fastening member is made of resin, metal, ceramic, an organic material or a cured glue, which manages to assume a fixed shape without being heated. The fastening member is made of a resin mixed filler, which needs to be heated so as to assume a fixed shape. The fastening member is made of an underfill, an epoxy resin or a photosensitive resin. The fastening member is of a columnar shape, a spherical shape, a conical shape, or an irregular three-dimensional shape.

The above-described structure further comprises a second carrier board coupled to the second surface of the first carrier board and the inactive surface of the semiconductor chip, a first adhesion layer is disposed on the second surface of the first carrier board to thereby be coupled to the second carrier board, and the inactive surface of the semiconductor chip is coupled to the second carrier board by means of a second adhesion layer. Alternatively, the second carrier board is coupled to the second surface of the first carrier board through a first adhesion layer, and the inactive surface of the semiconductor chip is coupled to the first adhesion layer through a second adhesion layer. The second carrier board is an insulation board, a core board with circuits on both sides thereof, a multi-layer circuit board, a dielectric layer, or a metal plate.

The above-described structure further comprises a build-up structure disposed on the first surface of the first carrier board and the active surface of the semiconductor chip, wherein the build-up structure comprises at least a dielectric layer, a wiring layer disposed on the dielectric layer, a plurality of conductive vias disposed in the dielectric layer and electrically connected to the wiring layer and the electrode pads of the active surface of the semiconductor chip. A plurality of electrical contact pads are provided on the wiring layer. A solder mask layer is disposed outward on the the build-up structure and has a plurality of openings for exposing the electrical contact pads, respectively. The dielectric layer is filled between the through hole and the semiconductor chip.

According to the present invention, the fastening member is disposed in the gap between the through hole and the semiconductor chip and abuts against the semiconductor chip so as to prevent positional offset of the semiconductor chip in the through hole as occurring in the prior art when the dielectric layer is laminated to the first carrier board and the semiconductor chip, thereby securing the semiconductor chip in position and ensuring reliable electrical connection between the conductive vias and the electrode pads of the semiconductor chip. As a result, the product yield is enhanced.

DETAILED DESCRIPTION OF PREFERRED EMBODIMENTS

The following illustrative embodiments are provided to illustrate the disclosure of the present invention, these and other advantages and effects can be apparent to those skilled in the art after reading this specification.

FIGS. 2A to 2D are schematic views of a method for fabricating a package structure according to the present invention.

Figure 2A:
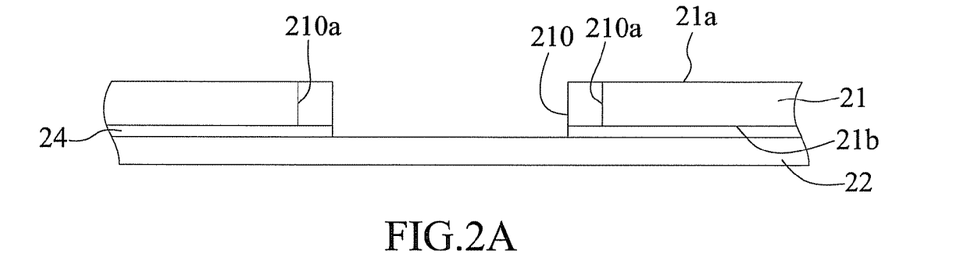
FIGS. 2A to 2D are schematic views of a method for fabricating a package structure according to the present invention, wherein FIG. 2A' and FIG. 2C' are top views of FIG. 2A and FIG. 2C, respectively, and FIG. 2D' is a schematic view of another embodiment of the method illustrated with FIG. 2D.

Referring to FIGS. 2A and 2A', wherein FIG. 2A' is a top view of FIG. 2A, a first carrier board 21 having a first surface 21a and an opposing second surface 21b is provided, and at least a rectangular through hole 210 is formed in the first carrier board 21 to penetrate the first and second surfaces 21a, 21b. As shown in the drawings, the through hole 210 is of a square shape, a polygonal shape, or any shape as needed.

A plurality of filling holes 210a are formed at the four sides of the through hole 210 to communicate therewith, wherein the filling holes 210a have an arc-shaped contour.

Subsequently, a first adhesion layer 24 is disposed on the second surface 21b of the first carrier board 21 to thereby be coupled to a second carrier board 22. In the present embodiment, the first adhesion layer 24 is not formed on the second carrier board 22 in the through hole 210.

The first carrier board 21 and the second carrier board 22 are each a core board with circuits on both sides thereof, a multi-layer circuit board, a dielectric layer or a metal plate. Further, the second carrier board 22 is an insulation board. Since different types of package substrates are used for embedding of semiconductor chips and they are well known in the art, detailed description thereof is omitted herein.

Figure 2B:
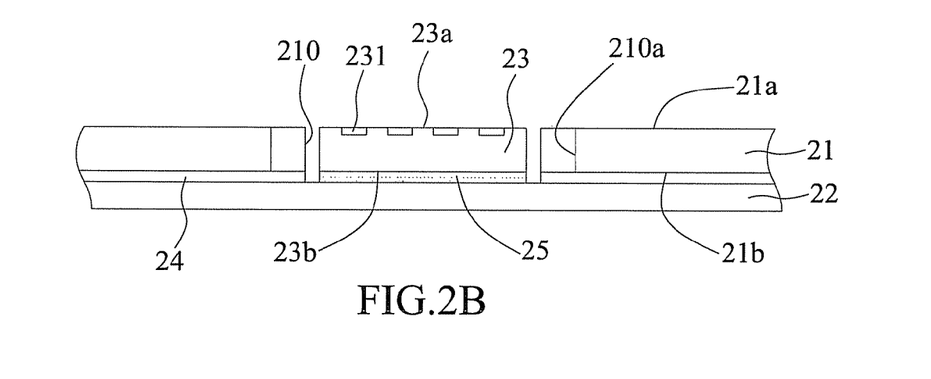

Referring to FIG. 2B, a semiconductor chip 23 having an active surface 23a with a plurality of electrode pads 231 formed thereon and an inactive surface 23b opposing the active surface 23a is provided and received in the through hole 210. As shown in the drawing, the inactive surface 23b is coupled to the second carrier board 22 through a second adhesion layer 25 such that the inactive surface 23b of the semiconductor chip 23 and the second surface 21b of the first carrier board 21 face the same direction.

Figure 2C:
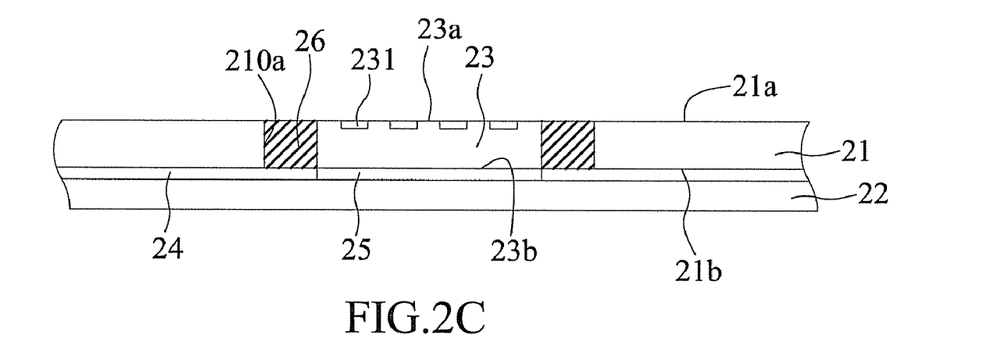

As shown in FIGS. 2C and 2C', wherein FIG. 2C' is a top view of FIG. 2C, a plurality of fastening members 26 are disposed in the filling holes 210a, wherein each of the fastening members 26 is of a cylindrical shape corresponding in shape to the filling holes 210a and protrude from the through hole 210 so as to abut against the four sides of the semiconductor chip 23. Despite a gap d between the through hole 210 and the semiconductor chip 23, with the fastening members 26 abutting against the sides of the semiconductor chip 23, the semiconductor chip 23 is securely positioned in the through hole 210 and yet does not manifest any positional offset otherwise found in the prior art.

Figure 2D:
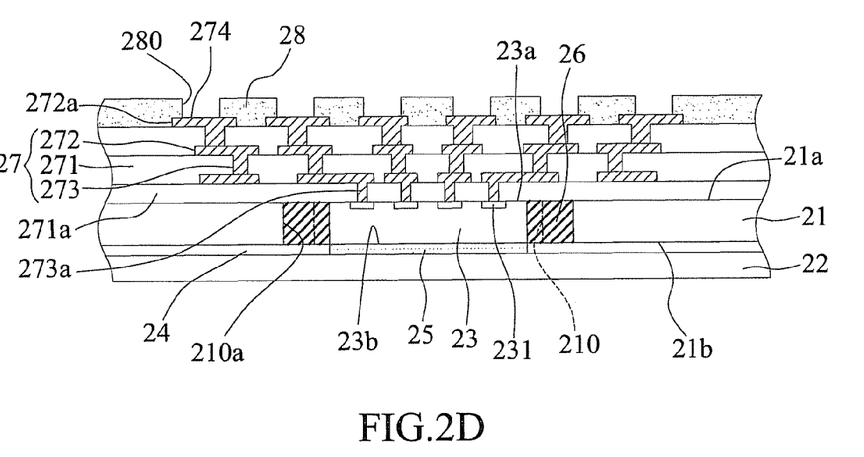

As shown in FIG. 2D, a build-up structure 27 is formed on the first surface 21a of the first carrier board 21 and the active surface 23a of the semiconductor chip 23.

The build-up structure 27 comprises at least a dielectric layer 271, a wiring layer 272 formed on the dielectric layer 271, and a plurality of conductive vias 273 formed in the dielectric layer 271 and electrically connected to the wiring layer 272, wherein portions of the conductive vias 273a are electrically connected to the electrode pads 231 of the semiconductor chip 23. A plurality of electrical contact pads 274 are formed on the wiring layer 272a, the outermost layer of the build-up structure 27. A solder mask layer 28 is formed outward on the build-up structure 27 and has a plurality of openings 280 for exposing the electrical contact pads 274, respectively.

Further, the dielectric layer 271a, which is the innermost layer of the build-up structure 27, is partially filled in the gap d (as shown in FIG. 2C') between the through hole 210 and the semiconductor chip 23 so as to strengthen the positioning effect of the semiconductor chip 23 in the through hole 210.

In the present embodiment, plated through holes (PTH) are formed in the first carrier board 21, the second carrier board 22 and the build-up structure 27. There are various plated through holes according to the prior art. Since related techniques are well known in the art and are not attributable to technical features of the present invention, detailed description of the related techniques is omitted herein.

FIG. 2D' shows another embodiment of the package structure. Unlike the above-described embodiment, in the present embodiment, the first adhesion layer 24 shown in FIG. 2D' is formed on the second carrier board 22 and the second carrier board 22 exposed from the through hole 210 such that the inactive surface 23b of the semiconductor chip 23 is coupled to the first adhesion layer 24 in the through hole 210 through a second adhesion layer 25.

Therefore, the fastening members 26 are disposed in the filling holes 210a at the four sides of the through hole 210 to thereby abut against the sides of the semiconductor chip 23 received in the through hole 210 so as to prevent the semiconductor chip 23 from a positional offset which might otherwise occur, as it does according to the prior art, when the dielectric layer 271a is subsequently laminated to the first carrier board 21 and the semiconductor chip 23, thereby allowing the semiconductor chip 23 to be better fixed in position to the through hole 210 and ensuring reliable electrical connection between the conductive vias 273a and the electrode pads 231.

Figure 3:
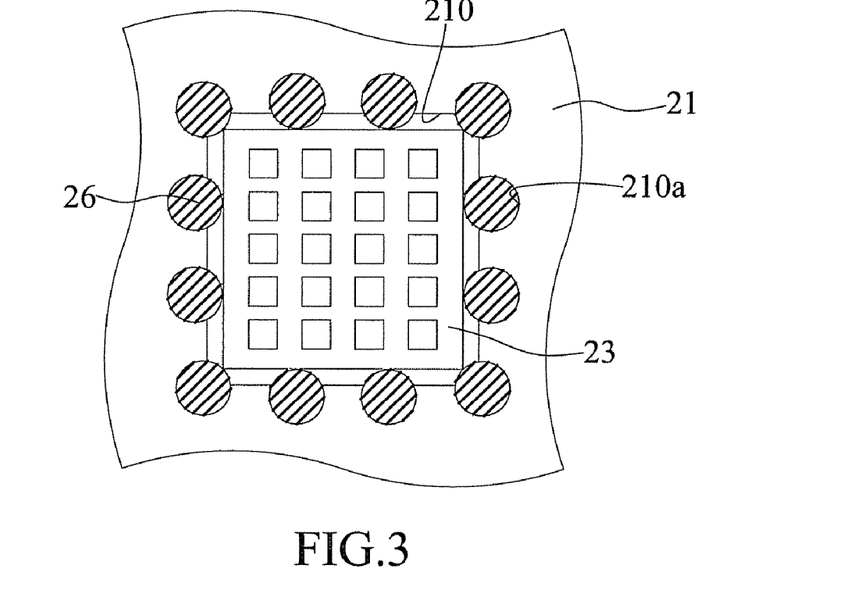
FIGS. 3 and 3' are schematic views of another embodiment of a package structure according to the present invention.

FIGS. 3 and 3' are schematic views of another embodiment of the package structure according to the present invention. The sole difference between FIGS. 3 and 3' in terms of respective embodiments illustrated therewith lies in the position and number of the filling holes 210a. Accordingly, a detailed description of the same processes and structures is omitted herein. Referring to FIG. 3, two filling holes 210a are formed at each side of the through hole 210, and a filling hole 210a is formed at each of the four corners of the through hole 210 such that a plurality of fastening members 26 are disposed in the filling holes 210a to abut against the semiconductor chip 23, thereby allowing the semiconductor chip 23 to be better fixed in position to the through hole 210. Alternatively, as shown in FIG. 3', the presence of the filling holes 210a is limited to the four corners of the through hole 210.

Figures 4A, 4B:
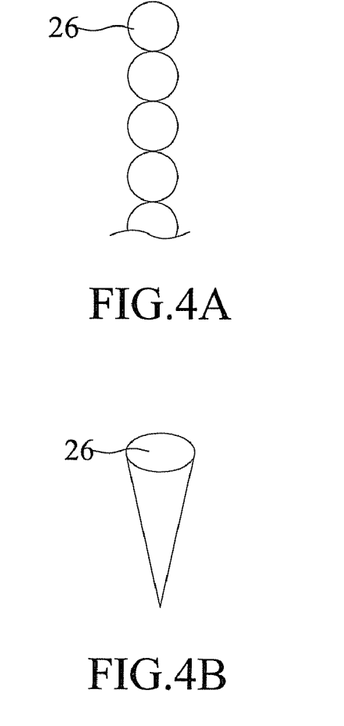
FIGS. 4A to 4E are perspective views of a fastening member of the package structure according to the present invention.
Figure 4C:
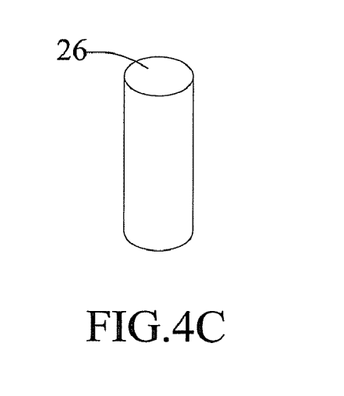
Figures 4D, 4E:
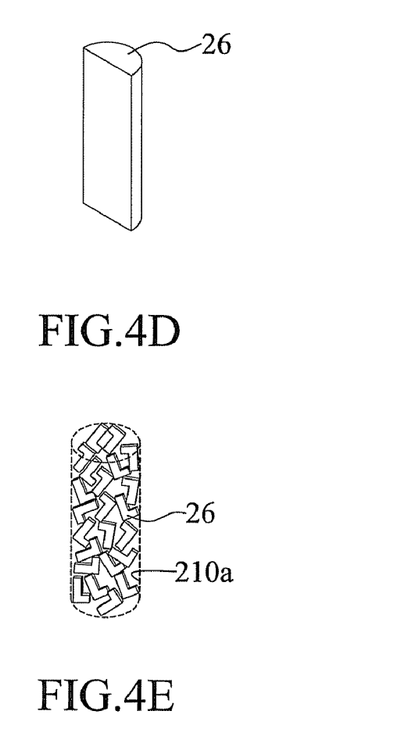

Referring to FIGS. 4A to 4E, the fastening members 26 made of resin, metal, ceramic, cured glue or an organic material assume a fixed shaped without being heated. Each of the fastening members 26 is of a columnar shape, a spherical shape, a conical shape or an irregular three-dimensional shape, as shown in FIG. 4E, allowing the fastening members 26 disposed in the filling holes 210a to efficiently abut against the semiconductor chip 23.

Figure 4F:
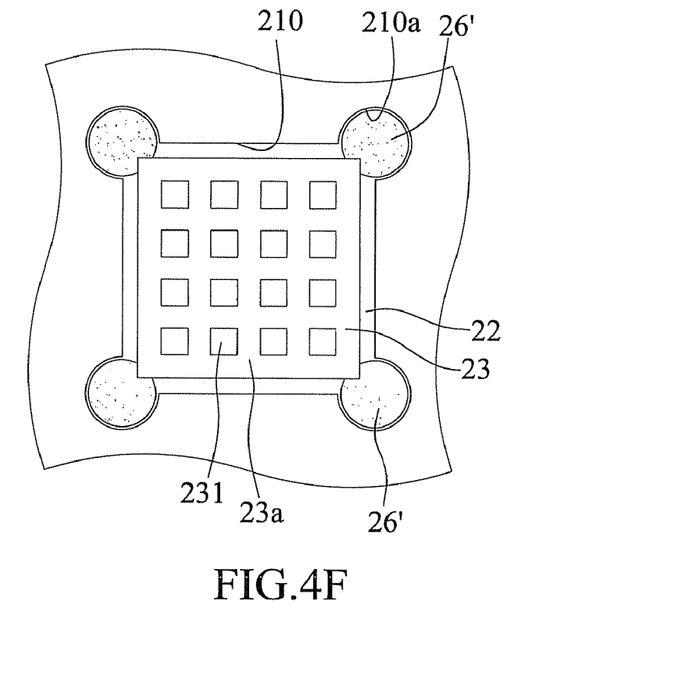
FIG. 4F is a schematic view of another embodiment of the fastening member according to the present invention.

Referring to FIG. 4F, in another embodiment, a fastening members 26' made of a resin mixed filler is heated at low temperature so as to assume a fixed shape. Alternatively, the fastening members 26' are made of an underfill, an epoxy resin, or a photosensitive resin. With a glue (not shown) applied to the filling holes 210a, the fastening members 26' are glued to the semiconductor chip 23; afterward, the fastening members 26' are cured by heating or UV radiation to allow the semiconductor chip 23 to be fixed in position to the through hole 210 of the first carrier board 21, as shown in the drawing.

According to the above-described method, the present invention further provides a package structure comprising a first carrier board 21, a semiconductor chip 23, and a fastening member 26.

The first carrier board 21 has a first surface 21a, an second surface 21b opposing the first surface 21a, at least a through hole 210 formed to penetrate the first surface 21a and the second surface 21b, and at least a filling hole 210a in communication with the through hole 210.

The semiconductor chip 23 is received in the through hole 210. The semiconductor chip 23 has an active surface 23a with a plurality of electrode pads 231 thereon and an inactive surface 23b opposing the active surface 23a.

The fastening member 26 fills the filling hole 210a to thereby abut against the semiconductor chip 23, thereby allowing the semiconductor chip 23 to be fixed in position to the through hole 210.

The package substrate further comprises a second carrier board 22 coupled to the second surface 21b of the first carrier board 21 through a first adhesion layer 24, and the inactive surface 23b of the semiconductor chip 23 is coupled to the second carrier board 22 through a second adhesion layer 25.

Referring to FIGS. 2D and and 2D' again, the package substrate further comprises the build-up structure 27 provided on the first surface 21a of the first carrier board 21 and the active surface 23a of the semiconductor chip 23.

The build-up structure 27 comprises at least a dielectric layer 271, a wiring layer 272 formed on the dielectric layer 271, and a plurality of conductive vias 273 formed in the dielectric layer 271 and electrically connected to the wiring layer 272, wherein portions of the conductive vias 273a are electrically connected to the electrode pads 231 of the semiconductor chip 23. A plurality of electrical contact pads 274 are formed on the wiring layer 272a, the outermost layer of the build-up structure 27. A solder mask layer 28 is formed outward on the build-up structure 27 and has a plurality of openings 280 for exposing the electrical contact pads 274, respectively.

According to the present invention, the fastening member is disposed in the filling hole and abuts against the semiconductor chip so as to prevent positional offset of the semiconductor chip as occurring in the prior art when the dielectric layer is laminated to the first carrier board and the semiconductor chip, thereby securely positioning the semiconductor chip in the through hole and ensuring reliable electrical connection between the conductive vias and the electrode pads. As a result, the product yield is enhanced.

The above-described descriptions of the detailed embodiments are only to illustrate the preferred implementation according to the present invention, and it is not to limit the scope of the present invention, Accordingly, all modifications and variations made to the embodiments by persons skilled in the art should fall within the scope of present invention defined by the appended claims.

What is claimed is:

1. A package structure, comprising:
a first carrier board having a first surface, a second surface opposing the first surface, a through hole formed to penetrate the first and second surfaces, and at least a filling hole in communication with the through hole;
a semiconductor chip received in the through hole to thereby provide a gap therebetween and having an active surface and an inactive surface, the active surface having a plurality of electrode pads provided thereon, and the inactive surface opposing the active surface and facing a same direction as the second surface of the first carrier board;
a fastening member fixed in position to the filling hole to thereby abut against the semiconductor chip and allow the semiconductor chip to be fixed in position; and
a dielectric layer filled between the through hole and the semiconductor chip, wherein a material of the fastening member is different from a material of the dielectric layer.

2. The package structure of claim 1, wherein the first carrier board is one of a core board with circuits on both sides thereof, a multi-layer circuit board, a dielectric layer and a metal plate.

3. The package structure of claim 1, wherein the through hole is of a square shape, a rectangular shape, or a polygonal shape.

4. The package structure of claim 3, wherein the first carrier board has a plurality of filling holes in communication with sides and corners of the through hole, respectively.

5. The package structure of claim 3, wherein the first carrier board has a plurality of filling holes in communication with sides of the through hole, respectively.

6. The package structure of claim 3, wherein the first carrier board has a plurality of filling holes in communication with corners of the through hole, respectively.

7. The package structure of claim 1, wherein the through hole is of a round shape, an oval shape or any other shape made up of curves.

8. The package structure of claim 1, wherein the fastening member is fixed in position to the filling hole and a portion of the through hole.

9. The package structure of claim 1, wherein the fastening member is fixed in position to the gap between the semiconductor chip and the through hole.

10. The package structure of claim 1, wherein the fastening member is made of resin, metal, ceramic, an organic material or a cured glue to thereby assume a fixed shape without being heated.

11. The package structure of claim 1, wherein the fastening member is made of a resin mixed filler to thereby assume a fixed shape when heated.

12. The package structure of claim 1, wherein the fastening member is made of an underfill, an epoxy resin or a photosensitive resin.

13. The package structure of claim 1, wherein the fastening member is of a columnar shape, a spherical shape, a conical shape or an irregular three-dimensional shape.

14. The package structure of claim 1, further comprising a second carrier board coupled to the second surface of the first carrier board and the inactive surface of the semiconductor chip.

15. The package structure of claim 14, further comprising: a first adhesion layer disposed on the second surface of the first carrier board to thereby be coupled to the second carrier board; and a second adhesion layer disposed on the inactive surface of the semiconductor chip to thereby be coupled to the second carrier board.

16. The package structure of claim 14, wherein the second carrier board is coupled to the second surface of the first carrier board through a first adhesion layer, and the inactive surface of the semiconductor chip is coupled to the first adhesion layer through a second adhesion layer.

17. The package structure of claim 14, wherein the second carrier board is one of an insulation board, a core board with circuits on both sides thereof, a multi-layer circuit board, a dielectric layer and a metal plate.

18. The package structure of claim 1, wherein the dielectric layer is provided on the first surface of the first carrier board and the active surface of the semiconductor chip, wherein a wiring layer is disposed on the dielectric layer, and a plurality of conductive vias are formed in the dielectric layer and electrically connected to the wiring layer and the electrode pads of the semiconductor chip.

19. The package structure of claim 18, further comprising a build-up structure provided on the dielectric layer and the wiring layer, wherein the build-up structure comprises:
    another dielectric layer;
    a wiring layer disposed on the another dielectric layer and configured to be an outermost layer of the build-up structure;
    a plurality of another conductive vias formed in the another dielectric layer and electrically connected to the wiring layer and another wiring layer; and
    a plurality of electrical contact pads provided on the another wiring layer, wherein a solder mask layer is disposed outward on the build-up structure and has a plurality of openings for exposing the electrical contact pads, respectively.

* * * * *